(12) United States Patent
Fukuda et al.

(10) Patent No.: US 7,701,212 B2
(45) Date of Patent: Apr. 20, 2010

(54) LOW TEMPERATURE PROBE AND NUCLEAR MAGNETIC RESONANCE ANALYSIS APPARATUS USING THE SAME

(75) Inventors: Yuzo Fukuda, Hitachi (JP); Hiroyuki Tanaka, Mito (JP)

(73) Assignee: Hitachi, Ltd. (JP)

( * ) Notice: Subject to any disclaimer, the term of this patent is extended or adjusted under 35 U.S.C. 154(b) by 140 days.

(21) Appl. No.: 11/877,978

(22) Filed: Oct. 24, 2007

(65) Prior Publication Data

US 2008/0122442 A1     May 29, 2008

Related U.S. Application Data

(63) Continuation of application No. 11/334,439, filed on Jan. 19, 2006, now Pat. No. 7,295,010.

(30) Foreign Application Priority Data

Jan. 20, 2005    (JP)   ............... 2005-012545

(51) Int. Cl.
*G01V 3/00*      (2006.01)
(52) U.S. Cl. ..................................... 324/318
(58) Field of Classification Search ......... 324/300–322; 62/324.1–324.2, 330–335, 515; 165/58–66, 165/104.11–104.34, 185–186
See application file for complete search history.

(56) References Cited

U.S. PATENT DOCUMENTS 5,889,456 A * 3/1999 Triebe et al. ................. 335/300

6,347,522 B1    2/2002   Maguire
7,295,010 B2 * 11/2007   Fukuda et al. .............. 324/318
2005/0046423 A1    3/2005   Marek

FOREIGN PATENT DOCUMENTS

| JP | 4-230880 | 8/1992 |
|---|---|---|
| JP | 5-45015 | 2/1993 |
| JP | 2003-519772 | 6/2003 |

* cited by examiner

*Primary Examiner*—Brij B Shrivastav
*Assistant Examiner*—Dixomara Vargas
(74) *Attorney, Agent, or Firm*—Antonelli, Terry, Stout & Kraus, LLP.

(57) ABSTRACT

A low temperature probe having a coil used in an NMR apparatus includes an opposed heat exchanger cooling a cooling medium, and a cooling apparatus having a first cooling stage capable of cooling to no more than 10K and a second cooling stage capable of cooling to at least 10K in series cooling the cooling medium from the opposed heat exchanger. A probe portion has a first heat exchanging portion executing heat exchange between the cooling medium and the coil, a circulation structure which circulates the cooling medium into the opposed heat exchanger, a second heat exchanging portion executing heat exchange between the cooling medium and a heat radiation shield. The heat radiation shield has a heat capacity greater than the heat capacity of the cooling medium.

4 Claims, 8 Drawing Sheets

$T_{H1} > T_{H2} \gg T_{L1} > T_{L2}$

LOW TEMPERATURE PROBE AND NUCLEAR MAGNETIC RESONANCE ANALYSIS APPARATUS USING THE SAME

CROSS REFERENCE TO RELATED APPLICATION

This application is a continuation of U.S. application Ser. No. 11/334,439, filed Jan. 19, 2006, now U.S. Pat. No. 7,295,010, the contents of which are incorporated herein by reference.

TECHNICAL FIELD

The present invention relates to a low temperature probe for a nuclear magnetic resonance (NMR), and a nuclear magnetic resonance analysis apparatus using the same.

BACKGROUND ART

The nuclear magnetic resonance apparatus corresponds to an apparatus for irradiating an electromagnetic wave in a state of arranging a sample below a static magnetic field, observing and analyzing a free attenuation signal from an atomic nucleus in the sample generated thereby, and executing a structural analysis of a material in the sample. In recent years, it is expected to be applied particularly to an organic polymer such as a protein or the like.

The conventional NMR apparatus is structured such that a superconducting magnet is arranged perpendicular to an installation surface, and a probe is inserted to the superconducting magnet from a vertical direction to the installation surface. On the other hand, a high sensitive NMR apparatus obtained by applying an improvement to the conventional NMR apparatus is described in patent documents 1 and 2 (JP-A-2003-329755 and JP-A-2003-329756). The high sensitive NMR apparatus is provided with a pair of split superconducting magnets arranged in a horizontal direction in the installation surface, and has a low temperature probe inserted to the split superconducting magnet from a horizontal direction and including a transmitting probe coil and a receiving probe coil.

In order to obtain a high sensitivity in the NMR apparatus, it is effective to cool the receiving probe coil to a very low temperature. In order to operate stably for a long time, there can be considered a method of cooling the receiving probe coil by circulating a cooling medium, however, a cooling performance of a refrigerating machine has a limit. Further, it is hard to obtain a temperature stability with respect to a heat generated in the transmitting probe coil at a time of irradiating a radio wave. In addition, since both of a specific heat and a coefficient of thermal conductivity become lower in most materials under a very low temperature state, it becomes further hard to obtain a high-level temperature-stability.

In order to obtain a temperature stability, there is a method utilizing a latent heat of a helium, however, a high cooling performance is required in the refrigerating machine, and a refrigerating machine utilizing a Joule-Thomson effect is frequently used. This kind of refrigerating machine having a high cooling performance is hard to be handled. A cooling apparatus using a general Gifford McMahon refrigerating machine (a GM refrigerating machine) rather has an advantage for a user although a cooling performance is inferior to the above.

Patent document 3 (JP-A-10-332801) describes a structure of an NMR probe which is operated at a very low temperature while using the cooling apparatus such as the GM refrigerating machine. However, in the case that the cooling apparatus is structured by one GM refrigerating machine and two or more countercurrent heat exchangers, it is hard to supply a cooling medium at a stable temperature with respect to a load fluctuation of the refrigerating machine. The load fluctuation in this case is constituted by an electric heat generation of the transmitting probe coil. If no countermeasure is applied, the temperature of the probe coil fluctuates at a certain cycle and a time constant.

In the structure of the single turn superconducting magnet and the low temperature probe as described in the patent document 3, the sensitivity is saturated together with a reduction of the temperature, and it is impossible to obtain a benefit caused by an improvement of the sensitivity on the basis of the cooling at a certain temperature or less. Accordingly, the receiving probe coil is cooled at a temperature in the vicinity of 20 K. On the other hand, in the low temperature probe having the split type superconducting magnet and the solenoid type receiving probe coil described in the patent documents 1 and 2, the sensitivity is described as being improved to a lower temperature. Therefore, the receiving probe coil is cooled in the vicinity of 5 K.

FIG. 9 shows a comparison between the temperature and the sensitivity in the solenoid type and split type probe coils. As illustrated, a sensitivity (S/N) of the split type is high in the low temperature region.

The probe of the NMR apparatus is sensitive to a fluctuation of the state. With respect to a room temperature and a temperature of a sample, a fluctuation width of 0.01 or a level in proportion thereto is often required. In the high sensitive NMR apparatus described in the patent documents 1 and 2, a temperature stability of the receiving probe coil is particularly important.

In the case of cooling the receiving probe coil in the very low temperature state by one of low temperature side stages of the refrigerating machine, if a temperature of a part of the circulating cooling medium is increased due to a heat generation of the transmitting probe coil or the like, it takes a long time to average a temperature of an entire of the circulating cooling medium. The cooling medium exchanging heat with the receiving probe coil has a time change with an external waviness. This phenomenon is not negligible in the case of the high sensitive measurement even in the conventional NMR apparatus. Further, in the ultrahigh sensitive NMR apparatus described in the patent documents 1 and 2, it is not allowable.

In the case that the conventional cooling apparatus is applied as it is to the low temperature probe of the ultrahigh sensitive NMR apparatus, the receiving probe coil has a risk in the temperature stability as mentioned above, and the reduction of the sensitivity caused thereby is calculated.

The temperature change of the probe coil and a resonance circuit portion forming a pair therewith causes a change in a circuit constant or the like, and exerts an influence on an acquired signal. In particular, there are generated a change in a resistance of a wiring on the basis of the temperature change, and a change in a capacity of a condenser. Further, there are generated a change in a resonance frequency, a change in a Q value, and a change in an input impedance.

In order to structure the high sensitive NMR apparatus, it is preferable that the Q value of the resonance is higher. The higher a purity of a material is, the more the material is affected by the temperature change. In the case that a superconductive material is used, the property is sensitively changed by the temperature. In addition, a very uniform magnetic field is required in the NMR apparatus, however, since a magnetism of the constituting material is changed by the temperature at the very low temperature, there is generated a problem relating to a magnetic homogeneity.

SUMMARY OF THE INVENTION

The present invention is made by taking the problem in the prior art mentioned above into consideration, and an object of the present invention is to provide a low temperature probe applying a high temperature stability to a receiving probe coil of the low temperature probe by using a cooling apparatus having a high temperature stability, for the purpose of bringing out a performance of an ultrahigh sensitive NMR apparatus, and a nuclear magnetic resonance analysis apparatus with a high sensitivity using the same.

In order to achieve the object mentioned above, in accordance with the present invention, there is provided a low temperature probe having a transmitting coil and a receiving coil or a transmit/receive coil, and used in an NMR apparatus, comprising:

an opposed head exchanger (called as a countercurrent heat exchanger in an embodiment) cooling a cooling medium at a room temperature from a compressor to 70 K or less in one side;

a cooling apparatus structured by connecting at least two refrigerating machines having two stages in series, and cooling the cooling medium from the opposed heat exchanger, the two cooling stages having a first cooling stage capable of cooling to 30 K or less and a second cooling stage capable of cooling to 4 K or less;

a probe portion having a first heat exchanging portion executing a heat exchange between the cooling medium from the cooling apparatus and the receiving coil or the transmit/receive coil; and a circulation structure circulating the cooling medium from the probe portion into the other side of the opposed heat exchanger.

Further, the structure is made such that the probe portion is provided with a second heat exchanging portion executing a heat exchange between the cooling medium from the first heat exchanging portion and a masking shield internally wrapping the cooling medium from the first heat exchanging portion and the receiving coil or the transmit/receive coil, and the cooling medium from the second heat exchanging portion is circulated into the other side of the opposed heat exchanger.

Further, the structure is made such that the opposed heat exchanger and the cooling apparatus are arranged in a vacuum tank, an outward route and a homeward route of the first heat exchanger and the second heat exchanger are connected by a pair of cooling medium transport paths.

Further, the structure is made such that a buffer tank having a larger capacity than the cooling medium flowing through the circulation structure is provided between an outlet of the compressor and an inlet of the opposed heat exchanger.

Further, the structure is made such that a piping diameter is made narrower toward a rear stage in a piping between the compressor and the opposed heat exchanger, a piping in the vicinity of the first cooling medium stage, a piping between the second cooling medium stages and a piping after the cooling medium stage.

Further, the structure is made such that the diameter of the piping between the second stages and after the piping is set about one third of the diameter of the piping in the vicinity of the first stage, and a length of the piping is set to about 1.7 times.

In accordance with the present invention, there is provided a nuclear magnetic resonance analysis apparatus comprising:

a split type superconducting coil; and a probe for an NMR inserted to the split, wherein the low temperature probe used in the NMR apparatus mentioned above is used in the NMR probe.

In accordance with the present invention, two or more GN refrigerating machines are used for the circulating cooling system capable of supplying the cooling medium having the very low temperature, a cooling order of the circulating cooling medium is constituted by a serial refrigerating machine connection, and the transmitting and receiving probe coil is cooled by a pair of reciprocating cooling medium transport paths (transfer tubes) and a radiant shield.

As mentioned above, in accordance with the present invention, it is possible to provide the low temperature probe in which the low temperature stability is high, by using the simple GM refrigerating machine. Further, it is possible to achieve the nuclear magnetic resonance analysis apparatus having the high sensitivity by using the low temperature probe.

Other objects, features and advantages of the invention will become apparent from the following description of the embodiments of the invention taken in conjunction with the accompanying drawings.

DESCRIPTION OF THE PREFERRED EMBODIMENTS

A description will be in detail given below of a plurality of embodiments in accordance with the present invention with reference to the accompanying drawings.

Embodiment 1

A nuclear magnetic resonance analysis (NMR) apparatus corresponds to an apparatus for irradiating an electromagnetic wave in a state of arranging a sample below a static magnetic field, observing and analyzing a free attenuation signal from an atomic nucleus in the sample generated thereby, and executing a structural analysis of a material in the sample. In recent years, it is expected to be applied particularly to an organic polymer such as a protein or the like.

In general, the NMR apparatus has a cylindrical superconducting magnet for generating a static magnetic field, and a probe constituted by a transmitting probe coil serving as a means for irradiating an electromagnetic wave with respect to a sample, and a receiving probe coil receiving a free attenuation signal. Further, the NMR apparatus is structured such as to be connected to the transmitting probe coil and the receiving probe coil and be provided with a measuring apparatus executing a measurement and an analysis of the signal.

Figure 2A:
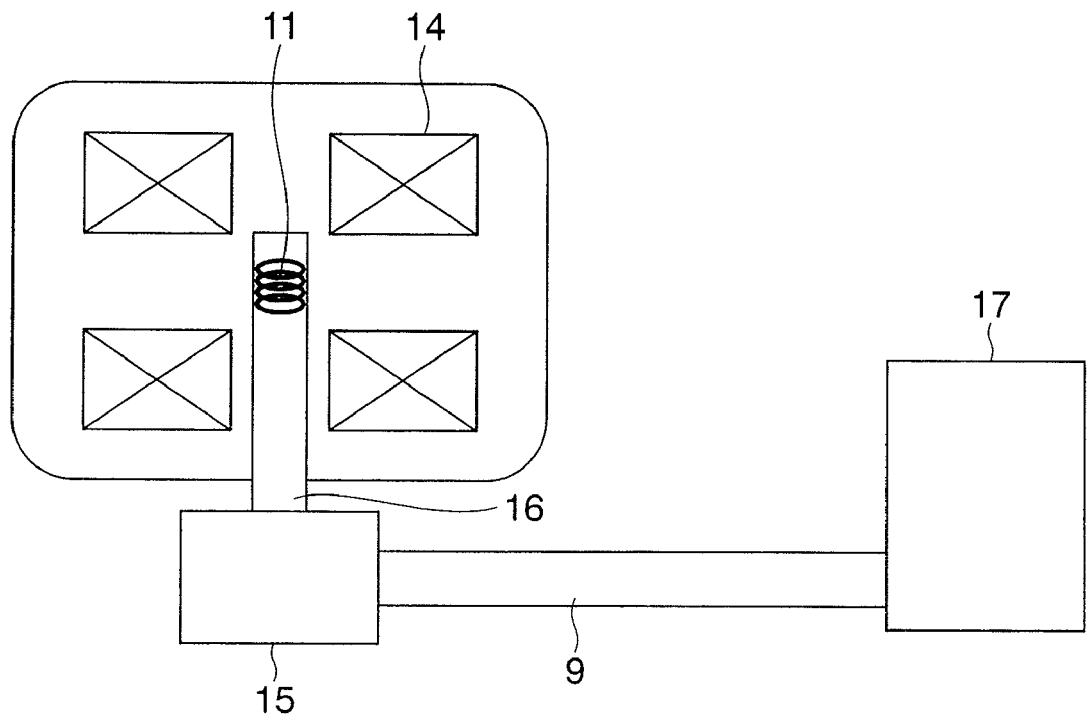
FIG. 2 is a schematic view of a high sensitive NMR apparatus.
Figure 2B:
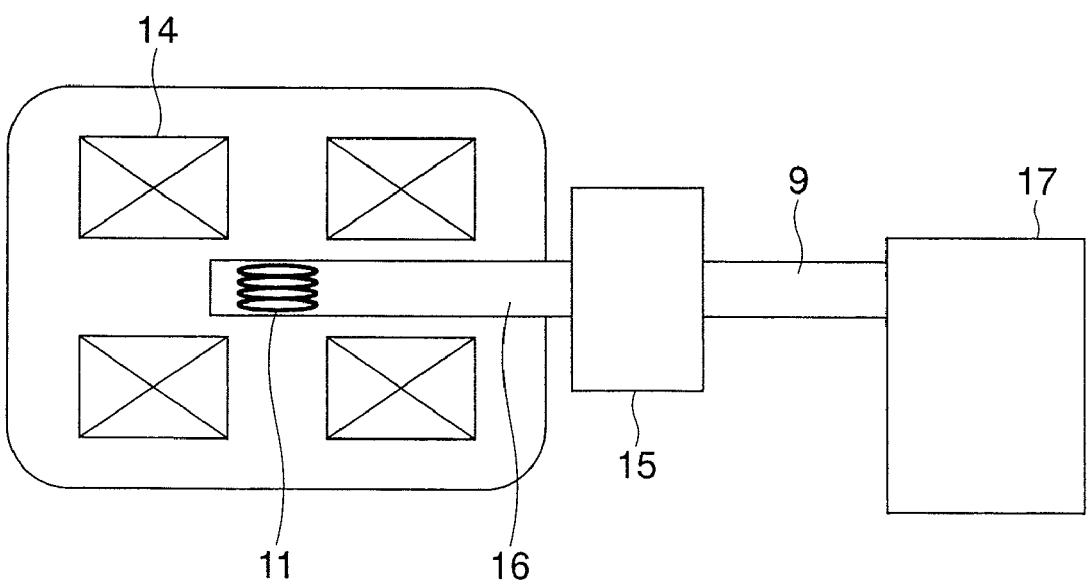

FIG. 2 shows a schematic view of an ultrahigh sensitive NMR apparatus in accordance with an embodiment 1. A superconducting magnet 14 is structured as a pair of split type, and has a low temperature probe having a transmitting probe coil and a receiving probe coil inserted to a split superconducting magnet. In FIG. 2A, a probe 15 is inserted in a vertical direction from a lower side of the magnet 14, and the receiving probe coil is arranged at a center of a uniform magnetic field formed by the superconducting magnet. In FIG. 2B, the probe 15 is inserted in a horizontal direction from a lateral side of the magnet 14, and the receiving probe coil is arranged at the center of the uniform magnetic field formed by the superconducting magnet.

Since it is necessary to cool down the receiving probe coil 11 to a very low temperature equal to or less than an approximately 20 K, a cooling apparatus 17 is attached to the probe 15 via a cooling medium transport path 9.

The receiving probe coil 11 is attached to a portion near a leading end of the probe 15, and is cooled down on the basis of a heat exchange with a cooling medium transported through a piping within the probe body 16. In the NMR apparatus aiming at an ultrahigh sensitivity, an operation temperature is required a very low temperature equal to or less than an approximately 10 K, desirably about 5 K. This means that a high signal-noise ratio (S/N) is obtained by lowering a thermal noise in the receiving probe coil 11 and an electric circuit portion. Further, in the case of the receiving coil using a superconducting pair, there is considered that a lower temperature can improve a characteristic of a superconductor.

Figure 3:
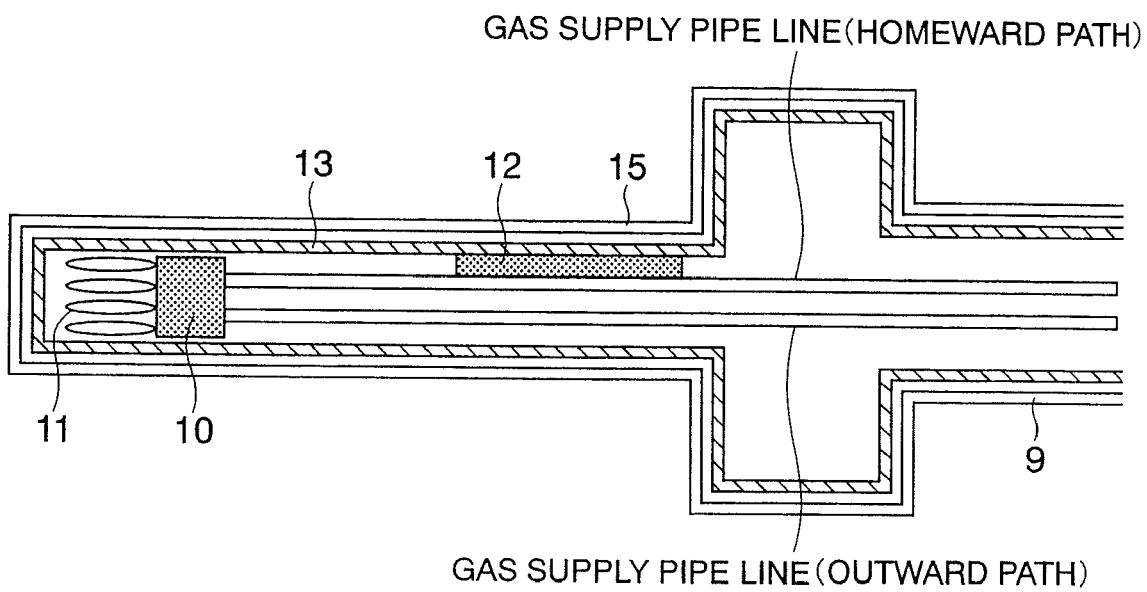
FIG. 3 is a view of a schematic structure of an integral type probe.

FIG. 3 shows an internal structure of the low temperature probe. An inner portion of the low temperature probe 15 is kept in a high vacuum state, and is vacuum insulated. A transmit/receive probe coil 11 is arranged near a leading end of a narrow and long cylinder inserted to the split of the superconducting magnet 14. A reciprocating gas supply pipe line transporting the cooling medium is extended near the transmit/receive probe coil. The cooling medium and the transmit/receive probe 11 are heat exchanged with each other via a heat exchanger 10, and the transmit/receive probe coil 11 is cooled. Further, in order to keep the inner portion at the very low temperature, a heat radiation shield 13 surrounds the receiving probe coil 11, the heat exchanger 10 and the pipe line. The heat radiation shield 13 exchanges heat with a heat exchanger 12 in a return side of the pipe line, and is cooled down.

FIG. 3 shows a structure in which the low temperature probe is inserted in the horizontal direction to the static magnetic field in the horizontal direction generated by the horizontal split type superconducting magnet, such as FIG. 2B. The structure is made such that the inserting direction of the probe and a direction of the magnetic field detected by the receiving probe coil 11 are orthogonal. On the other hand, in the case of FIG. 2A, the structure is made such that the inserting direction of the probe and the direction of the magnetic field detected by the receiving probe coil coincide with each other.

In the probe in FIG. 3, the transmit/receive probe coil is structured such that the receiving probe coil and the transmitting probe coil are integrated, and executes the transmit and receive by one probe coil. On the other hand, there is a case that the receiving probe coil and the transmitting probe coil are separated.

Figure 4:
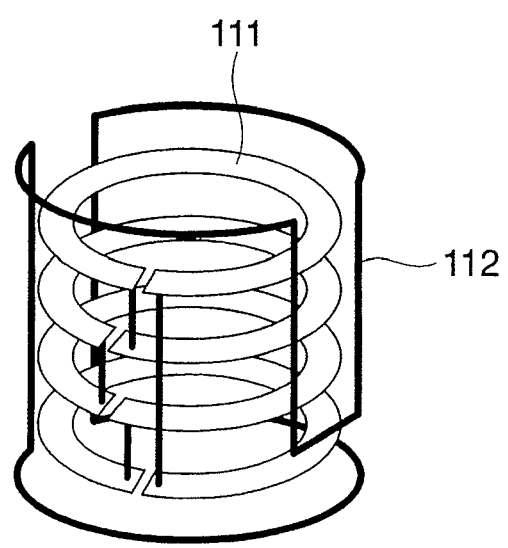
FIG. 4 is a view of a coil structure of a separate type probe.

FIG. 4 shows a structure in which the receiving probe coil and the transmitting probe coil are separated. As illustrated, a solenoid type coil 111 and a saddle type coil 112 are provided, and two coils are arranged such that an electromagnetic interaction becomes as small as possible. In this case, the solenoid type coil 111 in the inner side corresponds to the receiving probe coil employing the superconducting material, and the saddle type coil 112 in the outer side corresponds to the transmitting probe coil employing a normal conducting material. In this case, even if roles of the transmitting probe coil and the receiving probe coil are replaced, it is possible to measure, and it is possible to employ a structure in which the transmit and receive are integrated.

A description will be given below of a probe cooling system which is required for the ultrahigh sensitive NMR apparatus, and can obtain a high temperature stability of the receiving probe coil.

Figure 1:
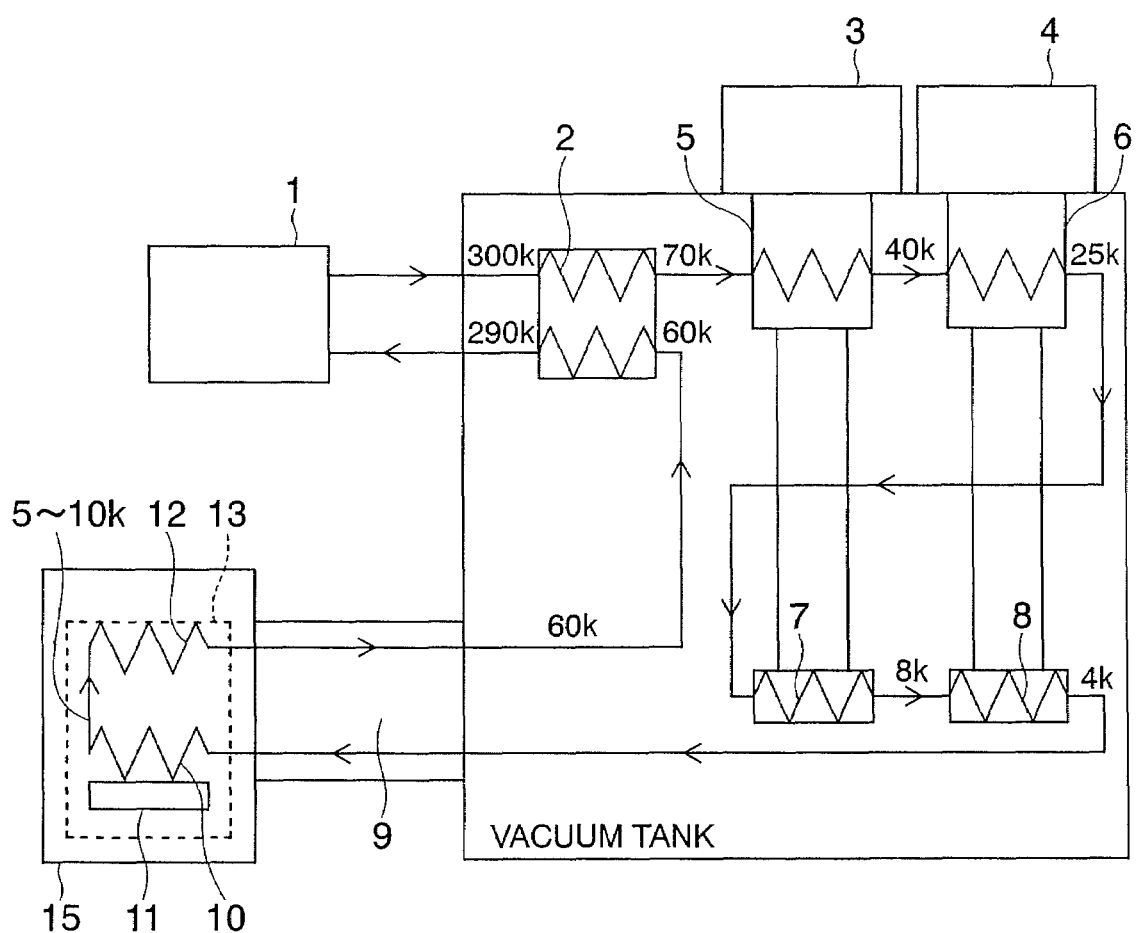
FIG. 1 is a schematic view of a low temperature probe in accordance with an embodiment 1 of the present invention.

FIG. 1 shows a schematic view of the low temperature probe in accordance with the embodiment 1 and a cooling apparatus thereof. In this case, a portion relating to a cooling structure is shown, and a description will be given of a case that two refrigerating machines are provided. Even if the number of the refrigerating machines is increased to three or four, the same principle is applied. It goes without saying that the probe of the NMR apparatus requires a resonance circuit with the transmit/receive probe coil, a high frequency cable, a preamplifier an adjusting mechanism for a resonance frequency and the like, in addition to the illustrated structure.

The refrigerating machines 3 and 4 used in the present embodiment are constituted by a two-stage GM refrigerating machine, and are structured such that an ultimate temperature of the first stages 5 and 6 is equal to or less than 25 K, an ultimate temperature of the second stages 7 and 8 is equal to or less than 3 K, and a refrigerating capacity at 4 K is about 1 W. The GM refrigerating machine corresponds to a refrigerating machine in which a helium gas is used as a cooling medium, a cooling operation is executed by repeating a compression and an expansion of the cooling medium, and a cool storage medium is arranged in a low temperature portion. It has a cooling capacity of about 1 W at a temperature of about 4 K, and has a great advantage that a very low temperature can be easily generated by pushing a button.

Figure 5A:
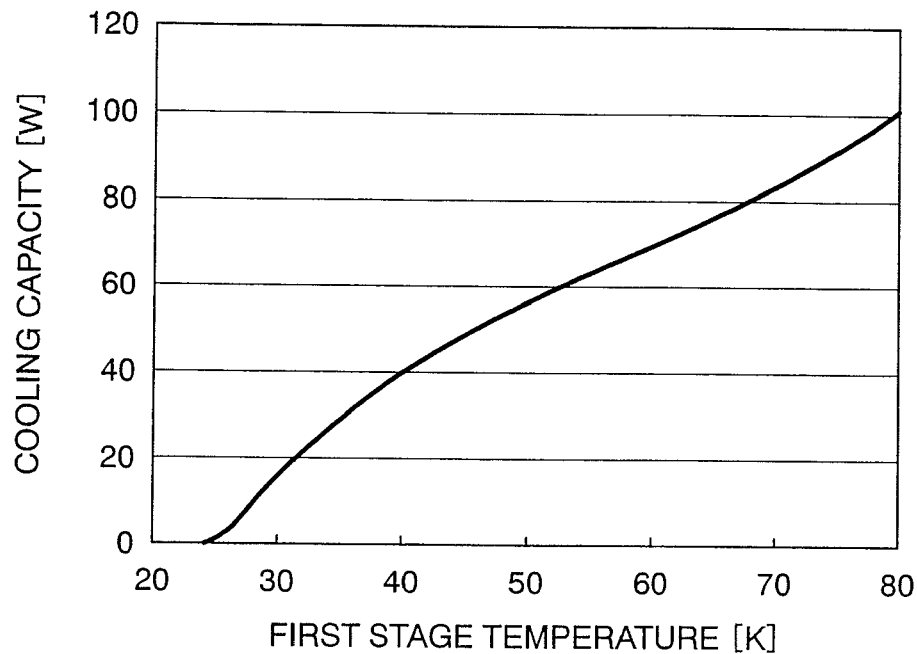
FIG. 5 is a characteristic view showing a capacity curve of a typical GM refrigerating machine.
Figure 5B:
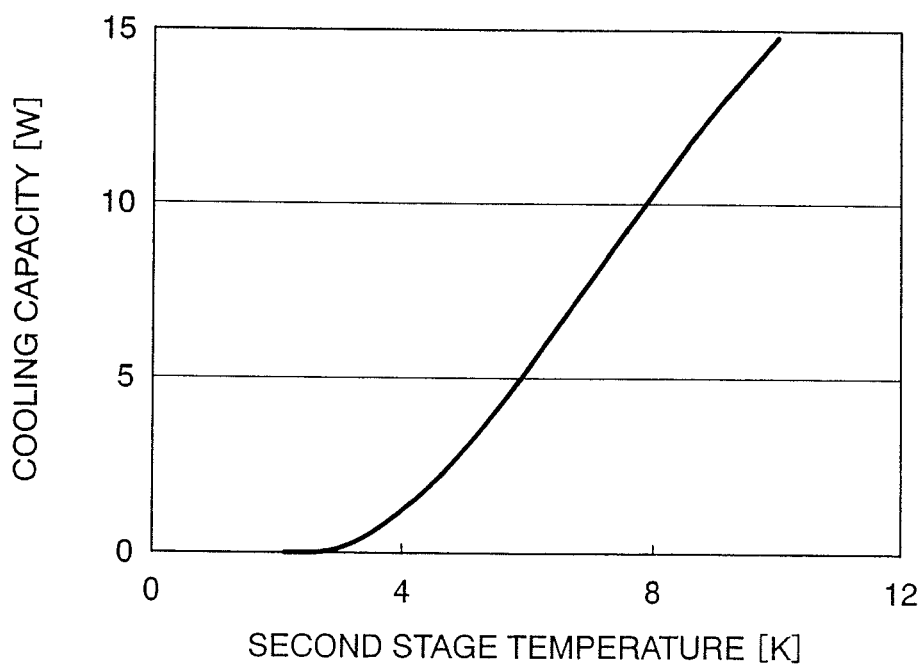

FIGS. 5A and 5B show a cooling capacity curve of a typical refrigerating machine. FIG. 5A shows a cooling capacity of a first stage, and FIG. 5B shows a cooling capacity of a second stage. The lower a stage temperature of the GM refrigerating machine is, the lower the cooling capacity is. Further, the second stage can cool to a lower temperature.

The cooling apparatus in accordance with the present embodiment circulates the cooling medium at a room temperature by a compressor 1. The compressor 1 has an intake port and a discharge port, compresses a gas taken from the intake port in an inner portion of the apparatus, and discharges the compression gas from the discharge port. Since a pressure difference is generated by the discharge port and the intake port, it is possible to circulate the gas within the piping. Since it is necessary to cool particularly the receiving probe coil 11 to a very low temperature, a helium gas is suitable for the circulating gas cooling medium. A description will be given below in the order of a circulating route.

The helium gas discharged from the compressor 1 and introduced into a refrigerating apparatus (a vacuum tank) from the room temperature through the piping is heat exchanged by the countercurrent heat exchanger 2. An inner side of the refrigerating apparatus is kept in a vacuum state for a heat insulation.

Figure 6:
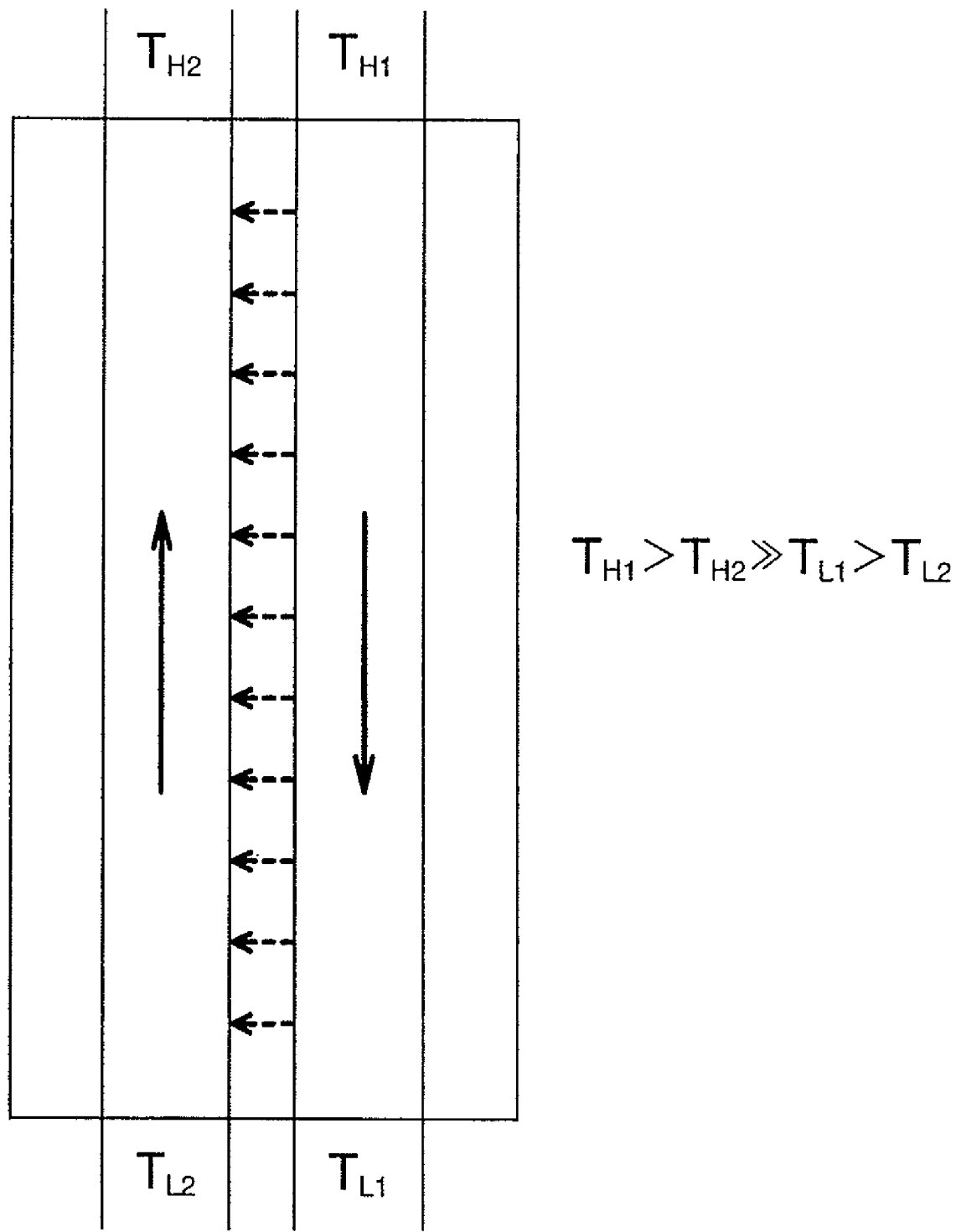
FIG. 6 is a view of a schematic structure of a countercurrent heat exchanger.

FIG. 6 is a schematic view showing a principle of the countercurrent heat exchanger. One side port of two adjacent flow paths forms a high temperature region, an opposite side port forms a low temperature region, and it is possible to execute a heat exchange between the flow paths. The helium gas introduced from the lower temperature side receives the heat, and comes closer to the temperature in the high temperature side so as to go out from the heat exchanger. On the contrary, the helium gas introduced from the high temperature side comes closer to the temperature in the low temperature side so as to go out from the heat exchanger.

The countercurrent heat exchanger 2 can form a cooling apparatus having a good efficiency by being inserted between the room temperature and the low temperature, between an intermediate temperature and a very low temperature and between regions having largely different temperatures. A temperature TH1 of the helium gas from the high temperature side of the countercurrent heat exchanger 2 is about 300 K corresponding to the room temperature, and a temperature TL2 of the helium gas moving forward from the lower temperature side is about 60 K. A temperature TL1 of the gas introduced from the room temperature is cooled to about 70 K by executing the heat exchange and an efficient circulation is executed.

The helium gas heat exchanged by the countercurrent heat exchanger 2 so as to be cooled leaves for the first cooling stage 5 of the first refrigerating machine 3. The temperature of the helium gas after the heat exchange by the countercurrent heat exchanger 2 is about 70 K, and an outlet temperature of the helium gas in the first cooling stage of the refrigerating machine 3 becomes about 40 K. Next, the outlet temperature of the first stage becomes about 25 K toward the first cooling stage 6 of the second refrigerating machine 4.

The temperature formed in the first stage is limited to 25 to 30 K in the general GM refrigerating machine. In order to cool to the lower temperature, it is necessary to cool by using the second stage as in the present embodiment.

The helium gas cooled to 70 K to 25 K by the first stage of the refrigerating machines 3 and 4 next leaves for the second stage 7 of the first refrigerating machine 3. In this case, the helium gas is cooled to about 8 K by the second stage 7 of the refrigerating machine 1, further leaves for the second stage 8 of the second refrigerating machine 4, and is cooled to about 4 K by the second stage 8.

In the following description, a description "series connection of refrigerating machines" means a connecting way in which the helium gas circulates through the first stage in the order of the refrigerating machines, and thereafter circulates through the second stage in the order of the refrigerating machines. The connection order does not change even in the case that the number of the refrigerating machines is increased.

As mentioned above, the helium is cooled to 4 K from about 70 K, and is introduced to the heat exchanger 10 with the transmit/receive probe coil 11 through the transfer tube 9. The heat exchanger 10 and the transmit/receive probe coil 11 are thermally connected, and the probe coil is cooled on the basis of a conduction. In this case, FIG. 1 shows only the receiving probe coil in the transmit/receive probe coil 11, however, the transmit/receive probe coil 11 is actually constituted by both the transmitting probe coil and the receiving probe coil as shown in FIG. 4.

It goes without saying that the structure can be made such that the transmit and receive are integrated. However, it is hard to employ the characteristic of the superconducting material under the high magnetic field as the transmitting probe coil or the high sensitive probe coil capable of transmitting and receiving. In other words, the transmitting probe coil generates a heat generation due to an electric factor, and the heat generation is largely changed in time due to a pulse of a radio wave. In particular, there exist a case that the heat generation is concentrated during some micro second, and a case that the heat generation is never generated.

Accordingly, the temperature of the helium ascends to about 5 to 10 K on the basis of the degree of the heat generation of the transmitting probe coil. Further, in order to efficiently execute the heat exchange, it is necessary to make a heat resistance between the receiving probe coil and the heat exchanger 10 as small as possible.

The transmit/receive probe coil is cooled on the basis of the conduction, however, the conduction portion can use a material having a high electric resistance and a high coefficient of thermal conductivity, for example, an aluminum nitride or a sapphire. If a material having a good conductivity is used, it is very hard to execute a normal measurement due to a noise by an eddy current. Accordingly, such a material can not be used. Further, in order to make the thermal resistance small, it is preferable to make a distance between the heat exchanger and the transmit/receive probe coil short so as to secure an area efficient for the heat transfer. It is possible to effectively cool the transmit/receive probe coil on the basis of the device mentioned above.

The helium warmed up by the probe coil 11 enters into the heat exchanger 12, and is utilized for cooling the radiation shield 13. The radiation shield 13 is cooled to about 40 to 60 K. In this case, the radiation shield 13 is arranged so as to surround the very low temperature region including the receiving probe coil 11, and serves to shield an approaching heat due to a radiation, and inhibit the approaching heat in the low temperature side.

The radiation shield 13 keeps the helium temperature after cooling the radiation shield approximately constant, in addition to the original role of shielding the heat intrusion on the basis of the radiation. This is because a heat capacity of the radiation shield 13 is sufficiently large in comparison with a heat capacity of the circulating helium. Accordingly, the temperature of the helium returned to the countercurrent heat exchanger 2 through the return path of the transfer tube 9 is kept approximately constant, and the helium gas which is again heat exchanged from the room temperature is always kept approximately at a fixed temperature. The temperature entering into the refrigerating machine is always approximately fixed, and the temperature after being cooled has a high stability. In this case, if the heat capacity of the radiation shield 13 is made too large, an effect obtained thereby is small, and an initial cooling time for cooling to a steady state from the room temperature only becomes long. As a material of the radiation shield 13, a material having a good heat conductivity, for example, an oxygen free copper, a high purity aluminum or the like is suitable.

The description is given of a matter that the helium gas circulating between the cooling apparatus and the probe is cooled to about 4 K within the cooling apparatus by connecting the pipes in the respective cooling stages 5 to 8 of the refrigerating machines 3 and 4 in series. A description will be further given below of details thereof.

A loss in the serial countercurrent heat exchanger 2 depends on a mass flow rate of the cooling medium. For example, in the countercurrent heat exchanger having an efficiency of about 0.95, a loss about 5 W is generated with respect to a flow rate of 0.1 l gram per second corresponding to an expected flow rate. A higher heat exchange efficiency is preferable in the countercurrent heat exchanger, however, too large size is disadvantageous in view of an entire of the apparatus. In the case that the flow rate of the cooling medium is set to 0.1 1 gram per second, a cooling amount in the refrigerating machine is about 40 W in total of the cooling stages, however, a cooling capacity effective for cooling the low temperature probe becomes about 35 W obtained by subtracting the loss 5 W mentioned above therefrom.

Accordingly, it is necessary to set a heat load of the entire low temperature probe including the cooling apparatus within the value. The heat load allowed by the calculation corresponds to a calorie making an intrusion into the radiation shield from the vacuum container at the room temperature, and is determined by a sum of the heat radiation and the calorie entering from the support portion of the shield.

In order to inhibit the heat intrusion on the basis of the heat radiation, it is effective to use a layered heat insulating material. The layered heat insulating material is structured by forming a metal film on a surface of a thin heat insulating sheet, and is used by being alternately lapped over a heat insulating spacer. The heat radiation shield is fixed and supported by using a heat insulating material such as an FRP or the like in such a manner that a heat entering amount becomes sufficiently small. The specification mentioned above can be achieved by designing while sufficiently paying an attention to the heat insulating property, as mentioned above.

Next, a description will be given of a flow rate of the helium gas for efficiently cooling. If the flow rate is made too large due to the loss of the countercurrent heat exchanger, it is impossible to make the temperature of the cooling medium sufficiently low. Further, on the other hand, if the flow rate is made too small, the temperature increase during the transport become large. For an efficient operation, it is necessary to operate in a state of setting a suitable flow rate.

An optimum flow rate is changed on the basis of a balance between the cooling capacity of the refrigerating machine and the heat load of the entire of the low temperature probe, however, is considered to exist between 0.05 and 0.5 gram per second in accordance with an estimation on the basis of the efficiency of the heat exchanger and the capacity of the refrigerating machine. It goes without saying that the cooling can be more efficiently executed in accordance that the heat load of the entire of the low temperature probe is smaller, and the efficiency of the countercurrent heat exchanger 2 is higher.

A specific heat of the cooling medium at the very low temperature corresponds to an important factor for obtaining a stability. In the case that the helium gas is employed as the cooling medium, the specific heat is between 4 and 5 K and becomes comparatively high. Accordingly, it is preferable to operate at a pressure between about 0.25 and 0.5 MPa. In order to keep the pressure stably, it is effective to connect a gas having a sufficiently larger than the amount of the gas circulating within the piping, as a buffer, to the piping at the room temperature.

Figure 7:
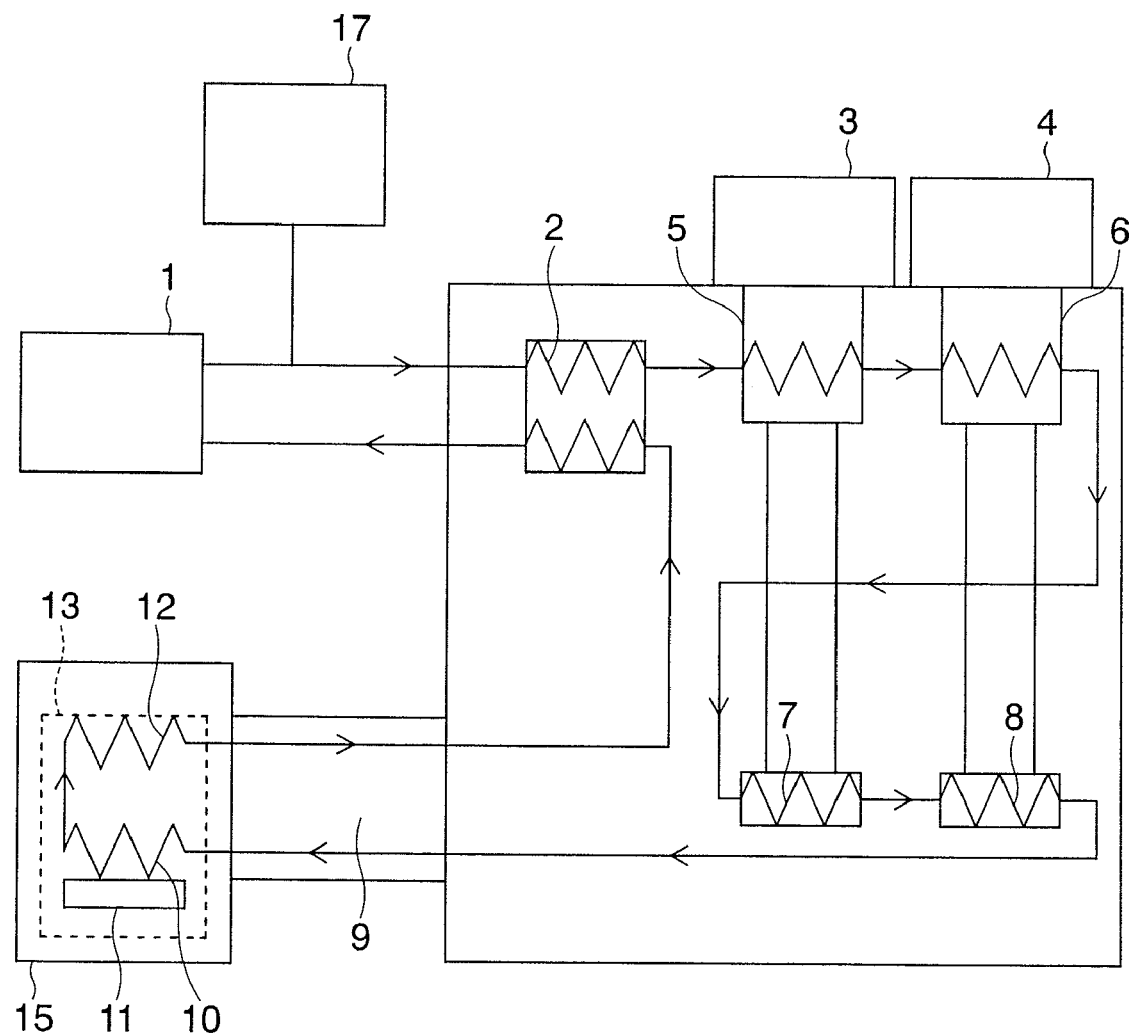
FIG. 7 is a schematic view of a low temperature probe provided with a buffer tank in the embodiment 1.

FIG. 7 shows a structure of a cooling system having a buffer tank. In comparison with the system in FIG. 1, a buffer tank 17 is provided, and a sufficiently larger amount of gas than the amount of the gas circulating within the piping is charged.

The refrigerating capacity itself is increased by using two or more refrigerating machines. In the present embodiment, since the cooling stages of two refrigerating machines are connected in series, the time varying heat load generated in the transmitting probe coil is taken on four cooling stages. Accordingly, it is possible to obtain a higher temperature stability than the case that the heat load is taken on only one cooling stage.

The cooling medium supply temperature is substantially determined by a temperature of the cooling stage in the final stage. A rate of the heat load fluctuation actually taken on the cooling stage in the final stage can be considered as (cooling capacity in final stage of refrigerating machine)/(cooling capacity of entire cooling stage). Accordingly, it becomes 1/40 of the heat load fluctuation in the case of being taken on one cooling stage, and it is possible to significantly inhibit the temperature fluctuation. For example, in the case that the temperature of the cooling medium gas before cooling becomes 1 K higher, the temperature of the cooling medium after cooling changes about 1/40 K.

As mentioned above, a multistage refrigerating machine is structured by connecting a plurality of refrigerating machines in series so as to increase a cooling capacity, and the fluctuation of the heat load is dispersed. Further, the cooling medium having a high temperature stability is supplied to the receiving probe coil by connecting the heat exchanger of the receiving probe coil and the heat exchanger of the radiation shield in series, and using the radiation shield as a thermal buffer.

It is possible to achieve the low temperature probe having a high stability on the basis of the provision of the cooling mechanism mentioned above. Further, it is possible to achieve the NMR apparatus suitable for the high sensitive measurement having a high stability, by using the low temperature probe in accordance with the present embodiment.

Embodiment 2

The cooling apparatus and the cooling mechanism of the low temperature probe described in the embodiment 1 do not particularly refer to the piping of the cooling medium. It is possible to further improve the cooling efficiency and the stability by devising a cross sectional shape of the piping.

Figure 8:
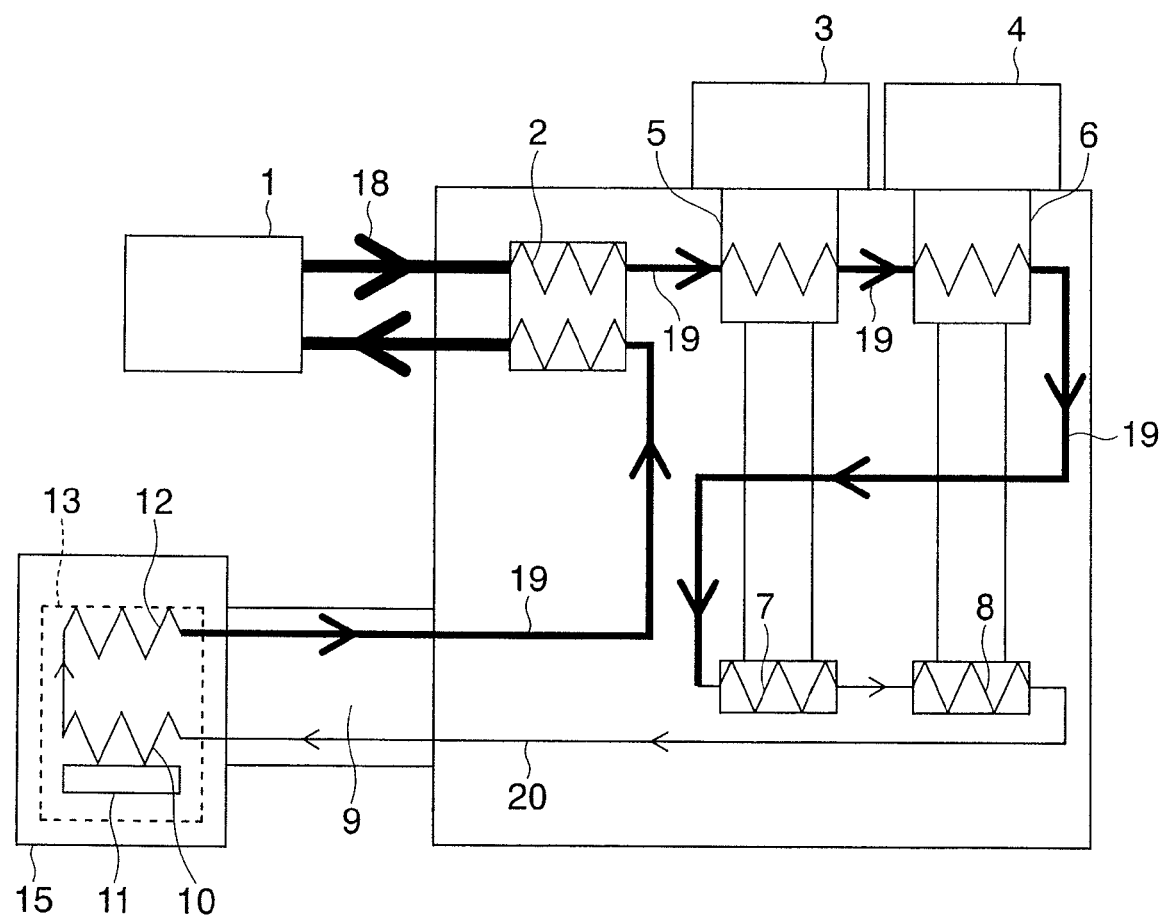
FIG. 8 is a schematic view of a low temperature probe in accordance with an embodiment 2 of the present invention.
Figure 9:
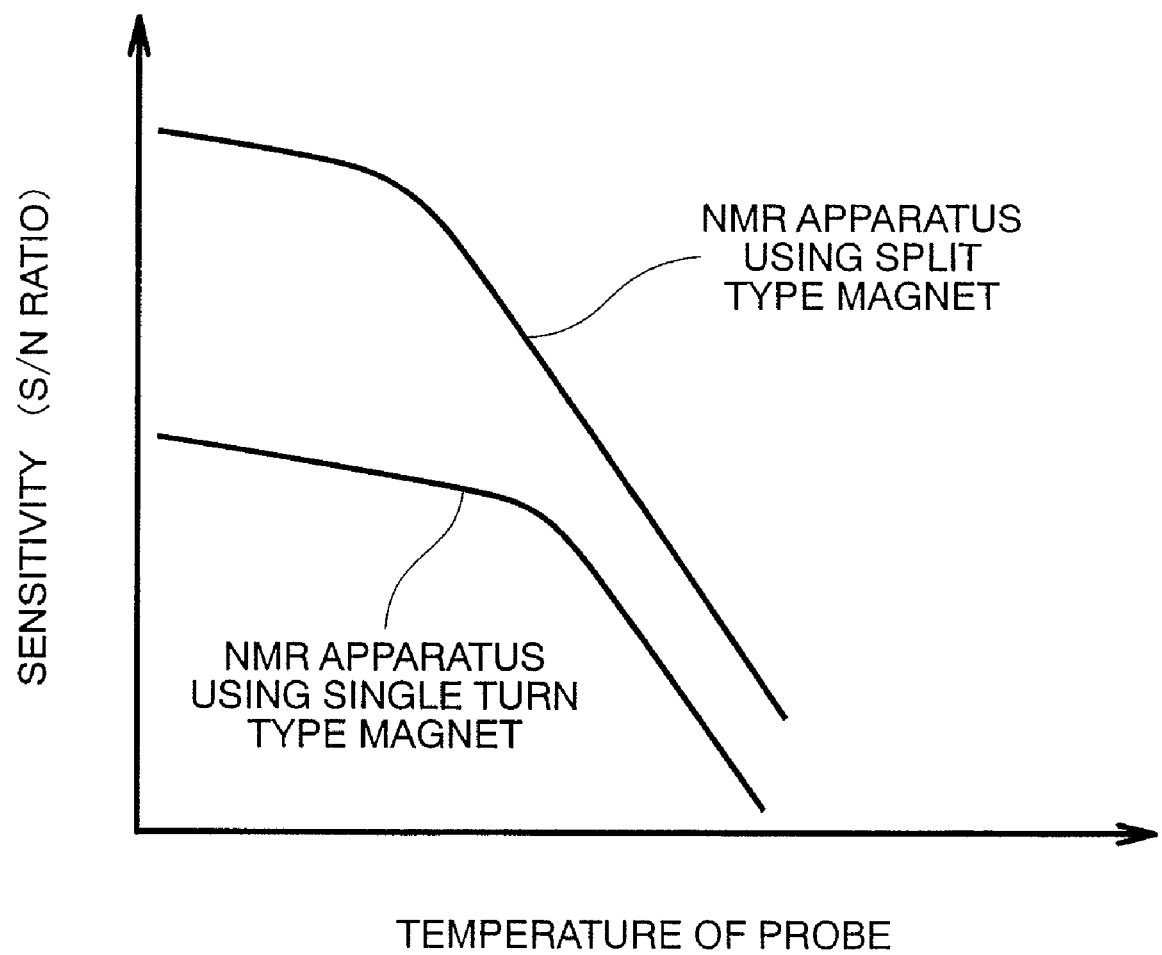
FIG. 9 is a characteristic view showing a comparison between a temperature and a sensitivity of a probe coil in an NMR apparatus.

FIG. 8 shows a cooling structure of a probe in accordance with an embodiment 2. A basic structure is not different from the embodiment 1 in FIG. 1, however, piping diameters of a pipe 18 at the room temperature, front and rear pipes 19 cooled in the first stages 5 and 6, and a pipe 20 after being cooled in the second stages 7 and 8 are changed. As illustrated, the pipe 18, the pipe 19 and the pipe 20 have different thicknesses, and the thickness of the pipe is made narrower in accordance with the lower temperature. The pipe 18 in the region of the room temperature is preferably structured such that the pressure loss is sufficiently smaller with respect to the circulating gas amount.

In the case that the helium is used as the cooling medium for cooling to the very low temperature, a volume at the room temperature and a volume at the low temperature are largely changed. In particular, a density of the helium at 0.5 MPa and 300 K is 0.8 kg/m3. On the contrary, it is 2.39 kg/m3 at 100 K and is 129 kg/m3 at 5 K. Since the mass flow amount becomes constant within the piping in a steady state in the case of connecting in series, a volume flow rate and a Reynolds number relating thereto are reduced in the low temperature portion. An efficiency of the heat exchanger is affected by a surface area of the flow path and a flow speed of the fluid, that is, the Reynolds number, and an efficiency of the heat exchange with the cooling stage is lowered in the second stage side in which the Reynolds number becomes lower, in comparison with the first stage side.

It is possible to execute the cooling operation without deteriorating the efficiency by reducing the flow path cross sectional area of the pipe in accordance with the cooling from 300 K, making the cross sectional area in the second stage portion about 1/3 in the first stage, and making the length thereof about 1.7 times, as in the present embodiment.

Actually, there is a method of structuring simpler and connecting the pipes having different thicknesses before or after the cooling head of the refrigerating machine. This method can make the designs of the heat exchangers in two stages common, and is advantageous in view of a cost in comparison with the case that two kinds of heat exchangers having largely different structures are prepared.

The lower the temperature is, the larger the change of the volume on the basis of the temperature change is. If the volume of the very low temperature region is set small, a variation of the change amount of the volume on the basis of a slight change of the temperature becomes small, and the pressure is hardly changed. As a result, the temperature is stabilized. The effect of making the thickness of the pipe smaller in accordance with the lower temperature further improves the effect applied to the stability of the buffer tank mentioned in the embodiment 1.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A low temperature probe having a transmitting coil and a receiving coil or a transmit/receive coil, and used in an NMR apparatus, comprising:
   an opposed heat exchanger cooling a cooling medium at a room temperature to no more than a predetermined temperature in one side;
   a cooling apparatus structured by connecting at least two refrigerating machines having two stages in series, and cooling the cooling medium from said opposed heat exchanger, said two cooling stages having a first cooling stage capable of cooling to no more than 10K and a second cooling stage capable of cooling to at least 10K;
   a probe portion having a first heat exchanging portion executing a heat exchange between the cooling medium from said cooling apparatus and said receiving coil or said transmit/receive coil; and
   a circulation structure circulating the cooling medium from said probe portion into an other side of said opposed heat exchanger;
   wherein said probe portion is provided with a second heat exchanging portion executing a heat exchange between the cooling medium from said first heat exchanging portion and a heat radiation shield disposed with respect to the cooling medium from said first heat exchanging portion and said receiving coil or said transmit/receive coil, and the cooling medium from said second heat exchanging portion being circulated into the other side of said opposed heat exchanger;
   wherein said first and second heat exchanging portions are disposed within said heat radiation shield;
   wherein said first heat exchanging portion and said receiving coil or said transmit/receive coil are thermally connected by a heat conduction portion of at least one of aluminum nitride and sapphire; and
   wherein said heat radiation shield has a heat capacity greater than the heat capacity of the cooling medium.

2. A low temperature probe for an NMR apparatus as claimed in claim 1, wherein the heat capacity of said heat radiation shield enables the cooling medium from said probe portion which is circulated into the other side of said opposed heat exchanger at a substantially constant temperature.

3. A low temperature probe for an NMR apparatus as claimed in claim 1, wherein said heat radiation shield is disposed so as to be cooled immediately after cooling of said probe portion.

4. A low temperature probe for an NMR apparatus as claimed in claim 1, wherein said heat radiation shield is formed of a material having a good heat conductivity.

* * * * *